United States Patent
Tan

(10) Patent No.: US 10,862,717 B2
(45) Date of Patent: Dec. 8, 2020

(54) MULTIRATE DATA FOR S-PARAMETER EXTRACTION

(71) Applicant: Tektronix, Inc., Beaverton, OR (US)

(72) Inventor: Kan Tan, Portland, OR (US)

(73) Assignee: Tektronix, Inc., Beaverton, OR (US)

( * ) Notice: Subject to any disclaimer, the term of this patent is extended or adjusted under 35 U.S.C. 154(b) by 0 days.

(21) Appl. No.: 16/775,671

(22) Filed: Jan. 29, 2020

(65) Prior Publication Data

US 2020/0252246 A1 Aug. 6, 2020

Related U.S. Application Data

(60) Provisional application No. 62/801,619, filed on Feb. 5, 2019.

(51) Int. Cl.
*H04L 25/03* (2006.01)

(52) U.S. Cl.
CPC .............. *H04L 25/03834* (2013.01)

(58) Field of Classification Search
CPC ...... G06F 17/17; G06F 11/221; G06F 11/263; G06F 17/141; G06F 30/33; G01R 31/11; G01R 27/28; G01R 31/3191; G01R 1/06794; G01R 31/00; G01R 23/16; H04B 3/46; H04B 2203/5425; H04B 15/005; H04M 3/2209; H04L 43/50; H04L 25/10; H04L 25/03; H04L 25/03834; H05K 1/112
See application file for complete search history.

(56) References Cited

U.S. PATENT DOCUMENTS

2013/0003804 A1* 1/2013 Baney .................... H04B 17/17
375/224

* cited by examiner

*Primary Examiner* — Rahel Guarino
(74) *Attorney, Agent, or Firm* — Miller Nash Graham & Dunn; Andrew J. Harrington

(57) ABSTRACT

An apparatus configured to acquire S-parameters of a communications channel includes a physical interface configured to transmit and receive signals through a communications channel under test, a processor, configured to execute instructions that, when executed cause the processor to: send a first data pattern from the transmitter through the communications channel at a first data rate; acquire a first waveform corresponding to the first data pattern and determine a first pulse response; calculate a first transfer function from the first pulse response; send a second data pattern from the transmitter through the communications channel at a second data rate; acquire a second waveform corresponding to the second data pattern and determine a second pulse response; calculate a second transfer function from the second pulse response; and combine the first and second transfer functions to determine an S-parameter of the communications channel.

20 Claims, 8 Drawing Sheets

MULTIRATE DATA FOR S-PARAMETER EXTRACTION

RELATED APPLICATIONS

This application is a continuation of, and claims priority to, U.S. Provisional Patent Application No. 62/801,619, filed Feb. 5, 2019.

TECHNICAL FIELD

This disclosure relates to test and measurement instruments, more particularly to using an oscilloscope to characterize a signal path.

BACKGROUND

High-speed serial data links are commonly used for communication between electrical devices. As the bit rate increases, simulation and measurement of these high-speed serial data links generally requires using S-parameters to characterize the components in the link for embed and deembed operations. For example, in the serial data link shown in FIG. 1, the output impedance (s22) of the transmitter (Tx) 10, input impedance (s11) of the receiver (Rx) 14, and full S-parameters of the channel 12 are all needed to fully characterize and simulate the link. The result is typically that the signals at the receiver can be adjusted to obtain the signal at the transmitter by removing the effects of the channel and the terminations, referred to as deembedding.

Traditionally, a vector network analyzer (VNA) or a time domain reflectometry (TDR) system with a sampling oscilloscope has been required to make this type of measurement of S-parameters for two-port or multi-port network characterization. Real-time oscilloscopes are also widely used to do high-speed serial data link debug, test and measurements. A real-time oscilloscope may be used in conjunction with a step signal generator to perform a time domain transmission (TDT) or time domain reflection (TDR) measurement of a link. This approach has a limitation on the bandwidth, as a step signal has a linearly decreasing energy over frequency in the dB scale.

In addition, a need often exists to characterize the transmitter and the channel, as the receiver interacts with the combined transmitter and channel. Most transmitters include signal generators that can generate step-like signals and various NRZ/PAM4 data patterns. An NRZ (non-return to zero) data pattern represents the binary high and low states transmitted by specific and constant direct current (DC) voltages. It may also be referred to as PAM-2 as it represents pulse-amplitude modulation, level 2. A PAM4 data pattern generally transmits 2 bits per symbol, cutting the bandwidth needed for a given data rate in half.

When using a step-like signal to extract S-parameters, the result accuracy and frequency span is limited by the energy of the step signal at higher frequencies. However, the more random NRZ/PAM4 data patterns, such as PRBS13 (pseudo-random binary sequence 13) for NRZ and PRBS12Q for PAM4 for example, have even higher energy at even higher frequencies. Most of the pseudo-random NRZ/PAM4 data patterns have a larger amount of transitions that carry more high frequency energy than a step signal, which has one transition if only rising or falling edge is counted, or two transitions if both rising and falling edges are counted.

Embodiments of the disclosed apparatus and methods address shortcomings in the prior art.

DETAILED DESCRIPTION

Figure 1:
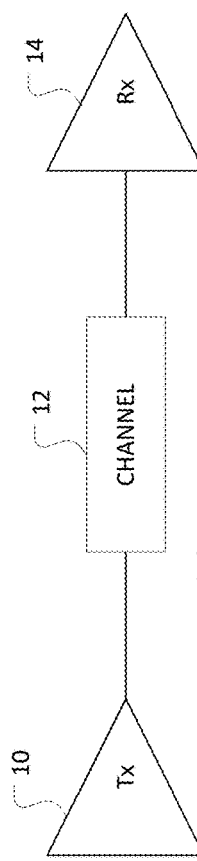
FIG. 1 shows an embodiment of a channel between a transmitter and a receiver.

The embodiments here may employ test instrumentation such as real-time oscilloscopes and sampling oscilloscopes (collectively, "scopes") that can acquire waveforms in place of the receiver ("Rx") shown in FIG. 1 in certain test configurations, such as transmitter testing and receiver calibration test. Sometimes, when the receivers are in place, probes are used with scopes to acquire the signal transmitted from the transmitter through the channel. This setup can be used for system debug and verification.

Figure 2:
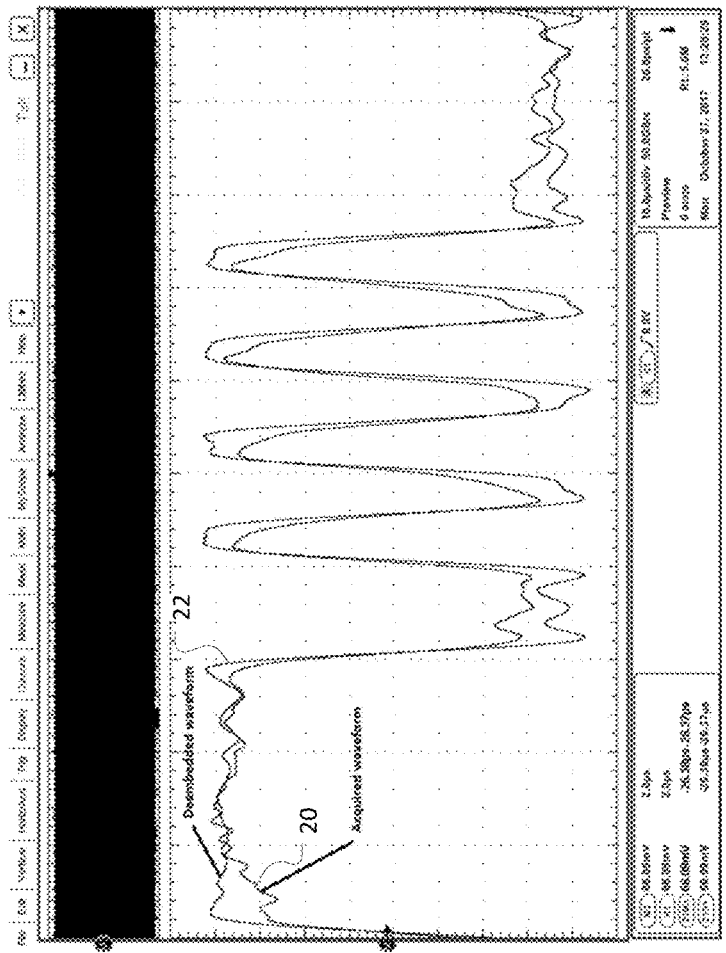
FIG. 2 shows a comparison of an acquired waveform and a deembedded waveform on a real-time oscilloscope.

A real-time scope can acquire a continuous time waveform of a data pattern whether the data pattern is repeating or not. An acquired NRZ waveform is shown in FIG. 2 with data rate of fb1=10 Gb/s. A sampling scope can only acquire repeating data pattern, because to achieve high bandwidths sampling scopes generally use equivalent time sampling, which depends on the pattern being repetitive. In most cases, the transmitters are capable to send repeating patterns. It can be assumed that repeating pattern is available for S-parameter extraction. In some cases, the transmitter is a signal generator such as a bit error rate tester (BERT), arbitrary waveform generator (AWG), pulse pattern generator (PPG), etc.

As can be seen in FIG. 2, the acquired waveform 20 differs from the actual deembedded waveform 22, because of the characteristics of the communications channel. When the channel undergoes characterization by determining the S-parameters of the channel, the instrument can apply those characteristics to deembed the effects of the channel to provide a more accurate waveform of the received signal.

Figure 3:
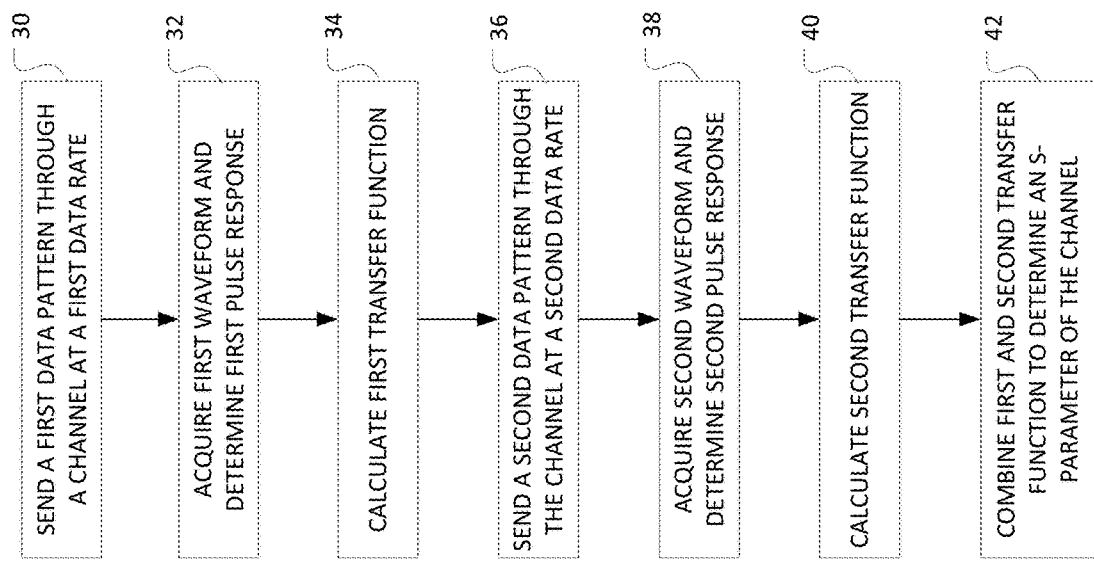
FIG. 3 shows a flowchart of a process to determine an S-parameter of a communication channel.

FIG. 3 shows an overall process for determining the S-parameter of a communications channel. Initially, a first data pattern at a first data rate is transmitted through the communications channel at 30. The scope them acquires the first waveform, in this case the acquired waveform shown in FIG. 2, and determines the pulse response from the first waveform, referred to here as the first pulse response at 32 in FIG. 3. This disclosure may use the terms "pulse" and "pulse response" interchangeably.

The pulse response may be determined from the acquired waveform by using an existing industry standard algorithm which extracts pulse response from the averaged pattern waveform based on linear fit. See IEEE, "IEEE 802.3ba 40 Gb/s and 100 Gb/s Ethernet Standard," http:// www.ieee802.org/3/, 2010, the contents of which are hereby incorporated by reference. A real-time scope can perform software clock recovery, which reduces trigger jitter. See Kan Tan, "Clock recovery for signals with spread spectrum clock through lossy channels," DesignCon 2016, Santa Clara, Calif., 2016, the contents of which are hereby incorporated by reference. Then the scope may resample the waveform based on the data rate, and the bit pattern may be detected, if the bit pattern is not known precisely. As a real-time scope can often acquire multiple pattern repeats in a single acquisition, averaging between multiples of pattern repeats that can be performed to get a cleaner averaged waveform. A sampling scope can be set to get average pattern waveforms.

Figure 4:
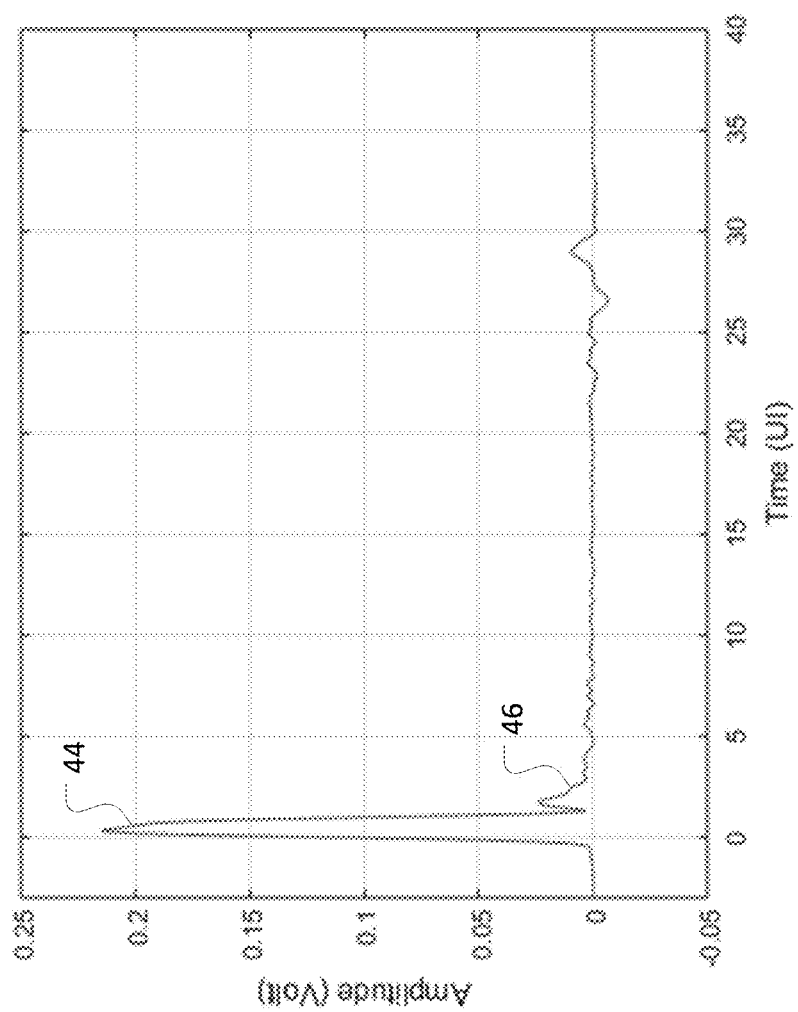
FIG. 4 shows an extracted pulse response from an acquired signal through an oscilloscope.

FIG. 4 shows the extracted pulse response 44 determined from the acquired waveform shown in FIG. 2. The unit interval (UI) is 100 ps. FIG. 4 shows the non-ideal pulse shape at the main cursor and a large discontinuity around 2.5 ns after the main cursor at 46, which may come from round-trip reflections.

Figure 5:
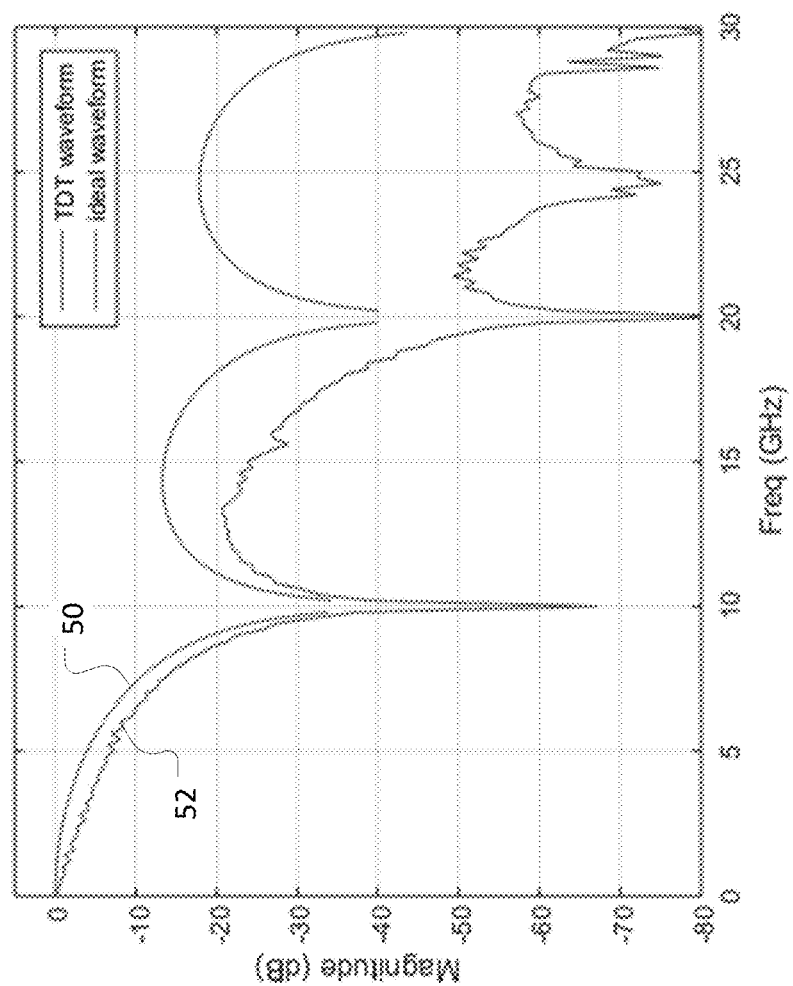
FIG. 5 shows a comparison of magnitude spectrums of the extracted pulse and an ideal pulse at a first data rate.

FIG. 5 shows the spectrum for the extracted pulse response 52, called the Time Domain Transmission, and the spectrum of an ideal pulse 50, referred to here as the ideal waveform at the same data rate, which is a square pulse. The ideal pulse width may be an inverse of the data rate. There are nulls, meaning zero in linear scale, negative infinity in dB scale, at multiples of the data rate of [fb1, 2*fb1, 3*fb1]=[10, 20, 30] GHz for the magnitude spectrum of the ideal pulse. This results from the sin(x)/x profile for the square waveform.

Returning to FIG. 3, at 34 the process then calculates a first transfer function based upon the spectrum of the first waveform. The S-parameter, or transfer function H_transfer_1 in the frequency domain, is the ratio between the spectrum of the acquired waveform H_tdt_1 over the spectrum of the ideal waveform H_ideal_1. The H_transfer_1 is well defined at frequency points except at the frequency points where H_ideal_1 has null values.

Figure 6:
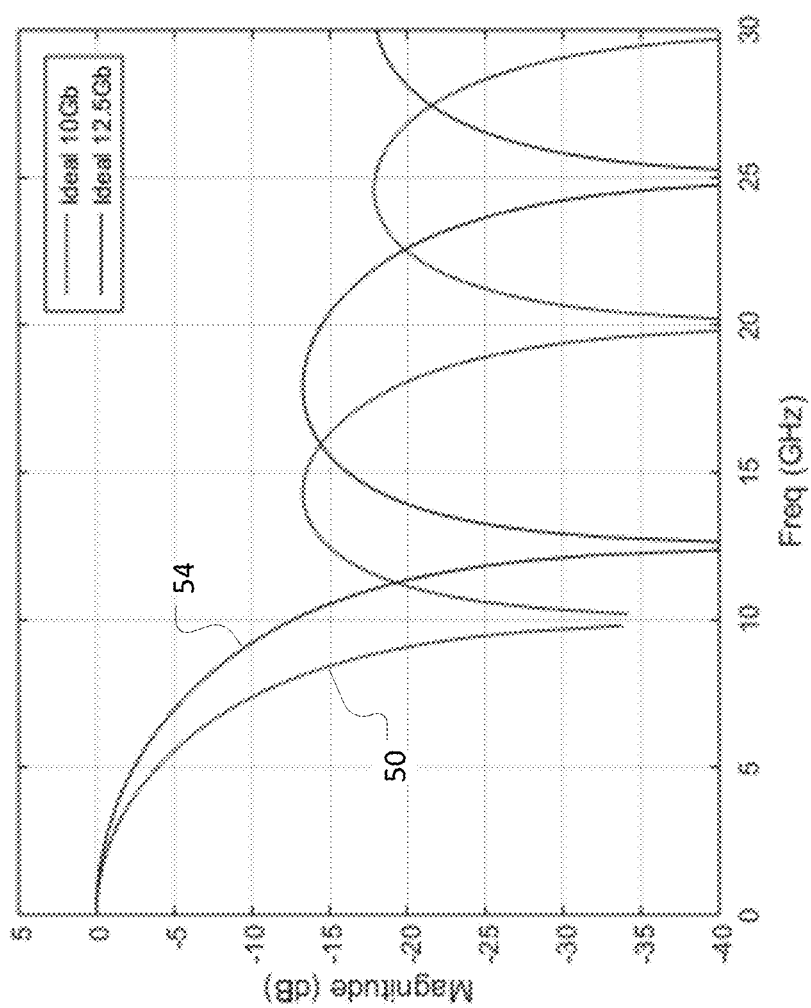
FIG. 6 shows magnitude spectrums of an ideal pulse at different data rates.

In addition to the data rate of fb1, which in this example was 10 Gb/s, the transmitter can send out the same or different data pattern at a different data rate fb2 at 36 of FIG. 3. The second data rate fb2 should be selected such that the nulls at its pulse spectrum, which are multiples of fb2, are different than the multiples of fb1 within the frequency span of interest. For example, fb2=12.5 Gb/s. It has nulls at [12.5, 25] GHz within 30 GHz range. The process acquires the second set of waveforms and determines the corresponding second pulse response at 38 in FIG. 3. Through the same process as described above, the process calculates a second transfer function H_transfer_2 at 40 of FIG. 3 with valid values except at frequency points where H_ideal_2 has nulls. FIG. 6 shows the magnitude spectrums of the ideal pulses at different data rates, with 50 being the ideal pulse at fb1, which in this example was at 10 Gb/s, and 54 being the ideal pulse at fb2, which in this example was at 12.5 Gb/s.

Returning to FIG. 3, the process combines the first and second transfer functions at 42 to determine an S-parameter of the channel. As the valid data of transfer functions H_transfer_1 and H_transfer_2 have overlap over significant frequency spans, the overlap can be used to align the phase response to remove the difference between the group delays between the two transfer functions. For example, the phase of H_transfer_1 and H_transfer_2 between DC and ¾*min(fb1, fb2) can be subtracted and the process can perform phase unwrap. Then the process can use line fit on the unwrapped phase difference to get a group delay difference value. The single group delay difference can be added to the phase of H_transfer_2 by adding additional group delay.

Once the two transfer functions get phase aligned, then the null points in one of the transfer function can be substitute with the valid data from the other transfer function at those frequency points. At the overlay frequency points where both transfer functions have valid data, they can be combined with proper weighting. In one embodiment, at certain frequencies, if H_ideal_1 has higher energy than H_ideal_2, then H_transfer_1 is weighted more than H_transfer_2 when combining the two.

Other variations and modifications fall within the scope of the embodiments and claims. For example, the process may use more than two data rates. Using more data rates increases the accuracy of the transfer functions, as there are better coverage of frequency points. At any given frequency point, there is at least some more reliable data as H_ideal_n generally has high energy. Averaging between all valid transfer function values at each frequency point will improve the results.

Figure 7:
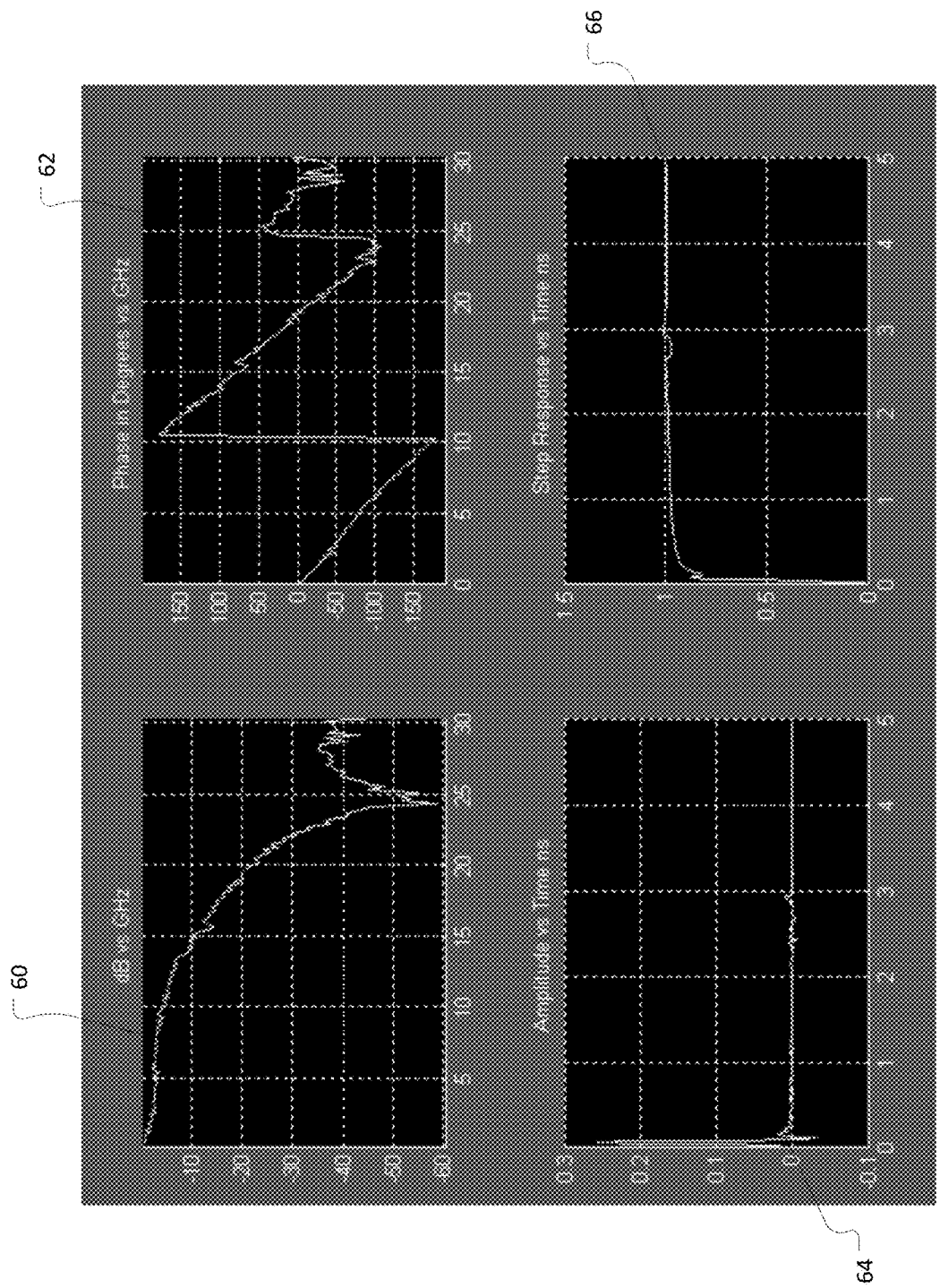
FIG. 7 shows magnitude, phase, impulse and step responses of an S-parameter transfer function.

FIG. 7 shows the resulting transfer function represented as an S-parameter. It has clean results up to 30 GHz and near −40 dB level. The top left subplot shows the magnitude response in frequency domain 60. The top right subplot shows the phase response in frequency domain 62. The bottom left subplot shows the impulse response in time domain 64. The bottom right subplot shows the step response in time domain 66. At the same time line where the discontinuity shows up in pulse response in FIG. 4, the discontinuity shows up in the impulse response and step response in FIG. 7.

The S-parameter can be used to design a deembed filter in the scope, the equalizers in transmitters, the equalizers in the receivers, or used in design simulation by other electronic design automation tools. The equalizer design in a transmitter can pre-compensate in the signal path impairment so the signal comes out at the end of the channel with better quality. This allows the receiver to detect the bit sequence with a lower bit error rate.

Figure 8:
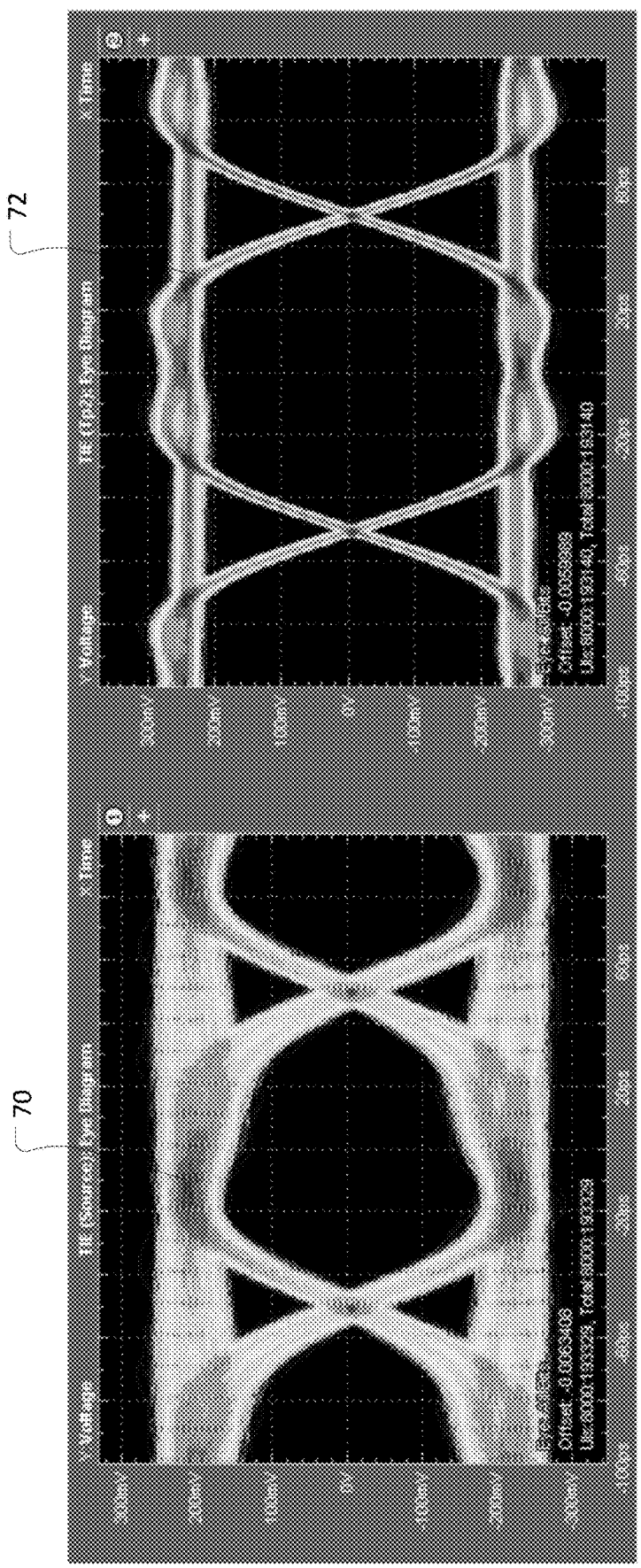
FIG. 8 shows a comparison of an eye diagram for an acquired waveform, and an eye diagram of a deembedded waveform.

For example, the S-parameter shown in FIG. 7 is used to design a deembed filter in a real-time scope. The deembedded waveform 22 acquired by applying the deembed filter on the acquired waveform 20 was shown in FIG. 2. FIG. 8 shows the eye diagrams derived from the acquired waveform at 70 and the eye diagram derived from the deembedded waveform at 72.

The multirate data S-parameter extraction approach works on both real-time scopes and sampling scopes to get S-parameters that characterize the combined impact on signal integrity from the transmitters and the channels. This approach uses the typical high-speed serial data transmitters for NRZ and PAM4 signaling that can generate PRBS data patterns. By using the multiple data rate settings, the resulting S-parameter is accurate in all frequency points it measures. The higher energy level at high frequencies enable this approach to get higher dynamic rage at wider bandwidth. For example, embodiments of the disclosed technology can measure the S-parameters up to 30 GHz and to −40 dB level.

Figure 9:
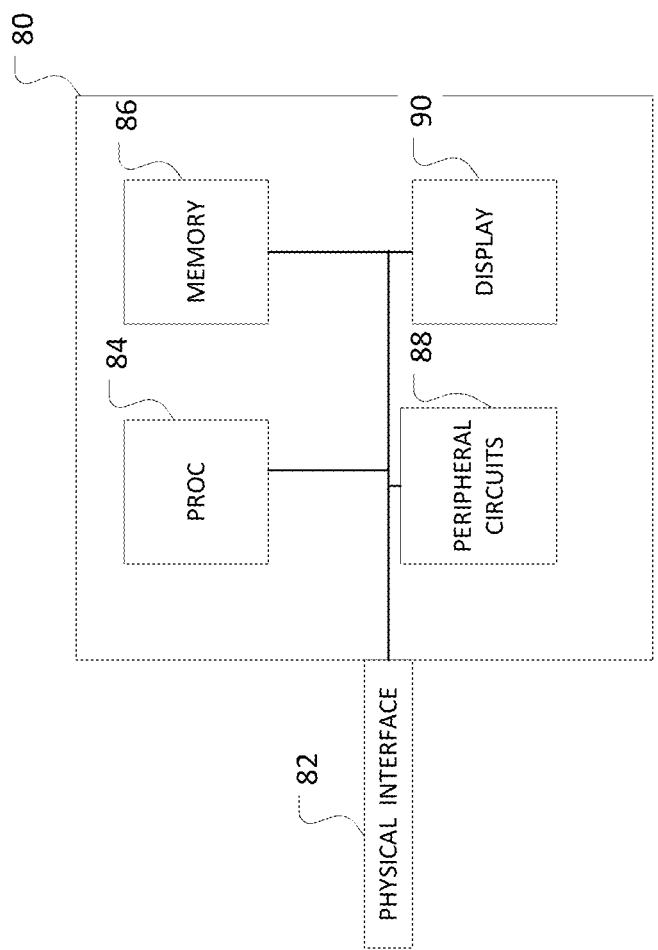
FIG. 9 shows a block diagram of an apparatus that can determine a S-parameter of a communications channel.

This process of determining the S-parameters of a communications channel may be implemented in a processor of the scopes themselves, as most available scopes have onboard computing devices, both real-time and sampling scopes. Alternatively, the apparatus may comprise a test instrument such as an oscilloscope operating under the control of a computer. FIG. 9 shows a block diagram of such a device. While the embodiment of FIG. 9 shows all of the parts of the system in one system, one should note that the different elements may be divided between a computer and an oscilloscope. In FIG. 9, the apparatus 80 comprises at least a physical interface 82 to allow the apparatus to acquire the waveforms, and may comprise multiple connections including connections to allow generation of the signals being sent in the communications channel. The apparatus includes a processor 84 to execute instructions that cause the processor to operate on the acquired waveform in the manner discussed above to acquire the S-parameters of a communications channel. The instructions and the acquired waveforms may be stored in a common memory such as 86, or in separate memories. The display 90 will display the waveforms. The incoming waveforms may also undergo processing by various peripheral circuits such as an analog-to-digital converter (ADC), a corresponding digital-to-analog converter (DAC), etc.

Similarly, aspects of the disclosure may operate on a particularly created hardware, on firmware, digital signal processors, or on a specially programmed general-purpose computer including a processor operating according to programmed instructions. The terms controller or processor as used herein are intended to include microprocessors, microcomputers, Application Specific Integrated Circuits (ASICs), and dedicated hardware controllers.

One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid-state memory, Random Access Memory (RAM), etc. As will be appreciated by one of skill in the art, the functionality of the program modules may be combined or distributed as desired in various aspects. In addition, the functionality may be embodied in whole or in part in firmware or hardware equivalents such as integrated circuits, FPGA (field programmable gate arrays), and the like. Particular data structures may be used to effectively implement one or more aspects of the disclosure more effectively, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

Additionally, this written description refers to particular features. One should understand that the disclosure in this specification includes all possible combinations of those particular features. For example, where a particular feature is disclosed in the context of a particular aspect, that feature can also be used, to the extent possible, in the context of other aspects.

Also, when reference is made in this application to a method having two or more defined steps or operations, the defined steps or operations can be carried out in any order or simultaneously, unless the context excludes those possibilities.

Although specific aspects of the disclosure have been illustrated and described for purposes of illustration, it will be understood that various modifications may be made without departing from the spirit and scope of the disclosure. Accordingly, the disclosure should not be limited except as by the appended claims.

EXAMPLES

Illustrative examples of the disclosed technologies are provided below. An embodiment of the technologies may include one or more, and any combination of, the examples described below.

Example 1 is an apparatus configured to determine an S-parameter of a communications channel, comprising: a physical interface configured to transmit and receive signals through a communications channel under test. The apparatus includes a processor configured to execute instructions that, when executed cause the processor to: acquire a first waveform corresponding to a first data pattern sent from a transmitter through the communications channel at a first data rate, and determine a first pulse response from the acquired first waveform; calculate a first transfer function from the first pulse response; acquire a second waveform corresponding to a second data pattern sent from the transmitter through the communications channel at a second data rate, and determine a second pulse response from the acquired second waveform; calculate a second transfer function from the second pulse response; and combine the first and second transfer functions to determine an S-parameter of the communications channel.

Example 2 is the apparatus of example 1, wherein the first data rate and the second data rate are selected such that the first and second data rates do not have overlapping null values.

Example 3 is the apparatus of either one of examples 1 and 2, wherein the instruction that causes the process to acquire the first waveform and acquire the second waveform includes an instruction that causes the processor to determine a first average waveform and a second average waveform.

Example 4 is the apparatus of example 3, wherein the apparatus comprises a real-time oscilloscope and the instruction that causes the processor to determine a first average waveform and a second average waveform further causes the processor to perform clock recovery to determine the first average waveform and the second average waveform.

Example 5 is the apparatus of example 3, wherein the apparatus comprises a sampling oscilloscope and the instruction that causes the processor to determine a first average waveform and a second average waveform further causes the processor to set an acquisition mode on the sampling oscilloscope to determine the first average waveform and the second average waveform.

Example 6 is the apparatus of any of the examples 1-5, wherein the instruction that causes the processor to calculate the first transfer function further causes the processor to: calculate a first ideal spectrum of a first ideal pulse, wherein the first ideal pulse width is an inverse of the first data rate; determine a first spectrum of the first pulse response; and use the ratio of the first spectrum to the first ideal spectrum as the first transfer function.

Example 7 is the apparatus of any of the examples 1-6, wherein the instruction that causes the processor to calculate the second transfer function further causes the processor to: calculate a second ideal spectrum of a second ideal pulse, wherein the second ideal pulse width is an inverse of the second data rate; determine a second spectrum of the second pulse response; and use the ratio of the second spectrum to the second ideal spectrum as the second transfer function.

Example 8 is the apparatus of any of the examples 1-7, wherein the instruction that causes the processor to combine the first transfer function and the second transfer function further causes the processor to align the first and second transfer functions.

Example 9 is the apparatus of any of the examples 1-8, wherein the instruction that causes the processor to align the first and second transfer functions further causes the processor to adjust a phase of the second transfer function to phase align the second transfer function with the first transfer function.

Example 10 is the apparatus of any of the examples 1-9, wherein the instruction that causes the processor to combine the first and second transfer functions further causes the processor to: use data from only one of the first and second transfer functions when the other of the first and second transfer functions has null data; and average data of the first transfer function and the second transfer function using a weighting based upon energy of the ideal spectrum.

Example 11 is a method of characterizing a communications link having a transmitter and a channel, comprising: sending a first data pattern from the transmitter through the channel at a first data rate; acquiring a first waveform corresponding to the first data pattern and determining a first pulse response from the acquired first waveform; calculating a first transfer function from the first pulse response; sending a second data pattern from the transmitter through the channel at a second data rate; acquiring a second waveform corresponding to the second data pattern and determining a second pulse response from the acquired second waveform; calculating a second transfer function from the second pulse response; and combining the first and second transfer functions to determine an S-parameter of the communications link.

Example 12 is the method of example 11, wherein the first data rate and the second data rate are selected such that the first and second data rates do not have overlapping null values.

Example 13 is the method of either one of examples 11 and 12, wherein acquiring the first waveform and acquiring the second waveform includes determining a first average waveform and a second average waveform.

Example 14 is the method of example 13, wherein determining a first average waveform and a second average waveform comprises performing clock recovery on a real-time oscilloscope used to acquire the first waveform and the second waveform.

Example 15 is the method of example 13, wherein determining a first average waveform and a second average waveform comprises setting an acquisition mode on a sampling oscilloscope to obtain the first average waveform and the second average waveform.

Example 16 is the method of any one of the examples 11-15 wherein calculating the first transfer function comprises: calculating a first ideal spectrum of a first ideal pulse, wherein the first ideal pulse width is an inverse of the first data rate; determining a first spectrum of the first pulse response; and using the ratio of the first spectrum to the first ideal spectrum as the first transfer function.

Example 17 is the method of any one of the examples 11-16, wherein calculating the second transfer function comprises: calculating a second ideal spectrum of a second ideal pulse, wherein the second ideal pulse width is an inverse of the second data rate; determining a second spectrum of the first pulse response; and using the ratio of the second spectrum to the second ideal spectrum as the second transfer function.

Example 18 is the method of any one of the examples 11-17, wherein combining the first transfer function and the second transfer function comprises aligning the first and second transfer functions.

Example 19 is the method of example 18, wherein aligning the first and second transfer functions comprises adjusting a phase of the second transfer function to phase align the second transfer function with the first transfer function.

Example 20 is the method of any of the examples 11-19, wherein combining the first and second transfer functions comprises: using data from only one of the first and second transfer functions when the other of the first and second transfer functions has null data; and averaging data of the first transfer function and the second transfer function using a weighting based upon energy of an ideal spectrum.

Although specific embodiments have been illustrated and described for purposes of illustration, it will be understood that various modifications may be made without departing from the spirit and scope of the disclosure. Accordingly, the invention should not be limited except as by the appended claims.

The invention claimed is:

1. An apparatus configured to determine an S-parameter of a communications channel, comprising:
   a physical interface configured to transmit and receive signals through a communications channel under test; and
   a processor, configured to execute instructions that, when executed cause the processor to:
   acquire a first waveform corresponding to a first data pattern sent from a transmitter through the communications channel at a first data rate, and determine a first pulse response from the acquired first waveform;
   calculate a first transfer function from the first pulse response;
   acquire a second waveform corresponding to a second data pattern sent from the transmitter through the communications channel at a second data rate, and determine a second pulse response from the acquired second waveform;

calculate a second transfer function from the second pulse response; and combine the first and second transfer functions to determine the S-parameter of the communications channel.

2. The apparatus as claimed in claim 1, wherein the first data rate and the second data rate are selected such that the first and second data rates do not have overlapping null values.

3. The apparatus as claimed in claim 1, wherein the instruction that causes the processor to acquire the first waveform and acquire the second waveform includes an instruction that causes the processor to determine a first average waveform and a second average waveform.

4. The apparatus as claimed in claim 3, wherein the apparatus comprises a real-time oscilloscope and the instruction that causes the processor to determine the first average waveform and the second average waveform further causes the processor to perform clock recovery to determine the first average waveform and the second average waveform.

5. The apparatus as claimed in claim 3, wherein the apparatus comprises a sampling oscilloscope and the instruction that causes the processor to determine the first average waveform and the second average waveform further causes the processor to set an acquisition mode on the sampling oscilloscope to determine the first average waveform and the second average waveform.

6. The apparatus as claimed in claim 1, wherein the instruction that causes the processor to calculate the first transfer function further causes the processor to:

calculate a first ideal spectrum of a first ideal pulse, wherein a first pulse width of the first ideal pulse is an inverse of the first data rate;

determine a first spectrum of the first pulse response; and use a ratio of the first spectrum to the first ideal spectrum as the first transfer function.

7. The apparatus as claimed in claim 1, wherein the instruction that causes the processor to calculate the second transfer function further causes the processor to:

calculate a second ideal spectrum of a second ideal pulse, wherein a second pulse width of the second ideal pulse is an inverse of the second data rate;

determine a second spectrum of the second pulse response; and use a ratio of the second spectrum to the second ideal spectrum as the second transfer function.

8. The apparatus as claimed in claim 1, wherein the instruction that causes the processor to combine the first transfer function and the second transfer function further causes the processor to align the first and second transfer functions.

9. The apparatus as claimed in claim 8, wherein the instruction that causes the processor to align the first and second transfer functions further causes the processor to adjust a phase of the second transfer function to phase align the second transfer function with the first transfer function.

10. The apparatus as claimed in claim 1, wherein the instruction that causes the processor to combine the first and second transfer functions further causes the processor to:

use data from only one of the first and second transfer functions when the other of the first and second transfer functions has null data; and average data of the first transfer function and the second transfer function using a weighting based upon energy of an ideal spectrum.

11. A method of characterizing a communications link having a transmitter and a channel, comprising:

sending a first data pattern from the transmitter through the channel at a first data rate;

acquiring a first waveform corresponding to the first data pattern and determining a first pulse response from the acquired first waveform;

calculating a first transfer function from the first pulse response;

sending a second data pattern from the transmitter through the channel at a second data rate;

acquiring a second waveform corresponding to the second data pattern and determining a second pulse response from the acquired second waveform;

calculating a second transfer function from the second pulse response; and combining the first and second transfer functions to determine an S-parameter of the communications link.

12. The method of characterizing the communications link as claimed in claim 11, wherein the first data rate and the second data rate are selected such that the first and second data rates do not have overlapping null values.

13. The method of characterizing the communications link as claimed in claim 11, wherein acquiring the first waveform and acquiring the second waveform includes determining a first average waveform and a second average waveform.

14. The method of characterizing the communications link as claimed in claim 13, wherein determining the first average waveform and the second average waveform comprises performing clock recovery on a real-time oscilloscope used to acquire the first waveform and the second waveform.

15. The method of characterizing the communications link as claimed in claim 13, wherein determining the first average waveform and the second average waveform comprises setting an acquisition mode on a sampling oscilloscope to obtain the first average waveform and the second average waveform.

16. The method of characterizing the communications link as claimed in claim 11, wherein calculating the first transfer function comprises:

calculating a first ideal spectrum of a first ideal pulse, wherein a first pulse width of the first ideal pulse is an inverse of the first data rate;

determining a first spectrum of the first pulse response; and using a ratio of the first spectrum to the first ideal spectrum as the first transfer function.

17. The method of characterizing the communications link as claimed in claim 11, wherein calculating the second transfer function comprises:

calculating a second ideal spectrum of a second ideal pulse, wherein a second pulse width of the second ideal pulse is an inverse of the second data rate;

determining a second spectrum of the first pulse response; and using a ratio of the second spectrum to the second ideal spectrum as the second transfer function.

18. The method of characterizing the communications link as claimed in claim 11, wherein combining the first transfer function and the second transfer function comprises aligning the first and second transfer functions.

19. The method of characterizing the communications link as claimed in claim 18, wherein aligning the first and second transfer functions comprises adjusting a phase of the second transfer function to phase align the second transfer function with the first transfer function.

20. The method of characterizing the communications link as claimed in claim 11, wherein combining the first and second transfer functions comprises:
   using data from only one of the first and second transfer functions when the other of the first and second transfer functions has null data; and
   averaging data of the first transfer function and the second transfer function using a weighting based upon energy of an ideal spectrum.

\* \* \* \* \*